(12) United States Patent
Lim

(10) Patent No.: US 7,796,030 B2
(45) Date of Patent: Sep. 14, 2010

(54) LED HOUSING

(76) Inventor: Lam Chiang Lim, 60 Mei Hwan Drive #06-03, Singapore (SG) 568426

( * ) Notice: Subject to any disclaimer, the term of this patent is extended or adjusted under 35 U.S.C. 154(b) by 224 days.

(21) Appl. No.: 12/154,930

(22) Filed: May 28, 2008

(65) Prior Publication Data

US 2008/0309504 A1 Dec. 18, 2008

Related U.S. Application Data

(62) Division of application No. 11/605,753, filed on Nov. 29, 2006, now Pat. No. 7,549,773.

(30) Foreign Application Priority Data

Dec. 29, 2005 (WO) ............... PCT/SG2005/000434

(51) Int. Cl.
*G08B 21/00* (2006.01)
*F21V 29/00* (2006.01)

(52) U.S. Cl. ................ 340/540; 362/120; 362/650; 362/800; 257/712

(58) Field of Classification Search ................ 340/500, 340/540; 362/646, 650, 800, 555, 120; 257/712, 257/718, 721, 722; 361/701
See application file for complete search history.

(56) References Cited

U.S. PATENT DOCUMENTS

| | | | |
|---|---|---|---|
| 3,705,316 A | 12/1972 | Burrous et al. | 327/513 |
| 5,534,718 A | 7/1996 | Chang | 257/98 |
| 5,783,909 A | 7/1998 | Hochstein | 315/159 |
| 6,274,924 B1 | 8/2001 | Carey et al. | 257/676 |
| 6,441,558 B1 | 8/2002 | Muthu et al. | 315/149 |
| 6,903,380 B2 | 6/2005 | Barnett et al. | 257/98 |
| 2002/0181231 A1 | 12/2002 | Luk | 362/240 |
| 2004/0130892 A1 | 7/2004 | Galli | 362/187 |
| 2005/0068776 A1 | 3/2005 | Ge | 362/296 |

FOREIGN PATENT DOCUMENTS

| | | |
|---|---|---|
| CN | 1068880 | 2/1993 |
| DE | 41 41 980 | 7/1993 |
| DE | 201 14 045 | 2/2002 |
| DE | 203 05 899 | 9/2003 |
| DE | 20 2004 013 775 | 12/2004 |
| DE | 20 2004 020 585 | 10/2005 |
| WO | 2005/024898 | 3/2005 |
| WO | 2005/067064 | 7/2005 |

OTHER PUBLICATIONS

International Search Report dated Apr. 28, 2006.

*Primary Examiner*—Brian A Zimmerman
*Assistant Examiner*—Sara Samson
(74) *Attorney, Agent, or Firm*—Nields, Lemack & Frame, LLC

(57) ABSTRACT

A high power LED Housing consisting of one or more LED to form a LED assembly fitted into a metal body having an upper portion with a gripping means and a lower portion with a fitting means and a base. The LED assembly is connected by electrical wire to a base of the metal body, the base of the metal body having an electrical contact.

By means of the gripping means, the LED housing can be installed or removed from a socket shaped to receive the LED housing.

The LED housing can be assembled into panels of LED housing which can be fitted with electrical and electronic circuits to monitor and control the operation of the LED housing for various applications.

5 Claims, 14 Drawing Sheets

Fig 1-1 (PRIOR ART)

$$R\theta_{\text{Junction-Ambient}} = \frac{\Delta T_{\text{Junction-Ambient}}}{P_d}$$

Where
$\Delta T = T_{\text{Junction}} - T_{\text{Ambient}}$ (deg C)
$P_d$ = Power dissipated (W)
= Forward Current (I F) × Forward voltage (V F)

Fig 1-2

$P_d = V_F \times I_F$ $R\theta$ J-S
$R\theta$ S-B
$R\theta$ B-A $R\theta$ Junction-Slug (J-S) = $R\theta$ from Die to Die epoxy and to slug material $R\theta$ Slug-Board (S-B) = $R\theta$ from epoxy between slug and board and board to board (MCPCB) material $R\theta$ Board-Ambient (B-A) = $R\theta$ from adhesive between the heat sink and the board to the heat sink into ambient air

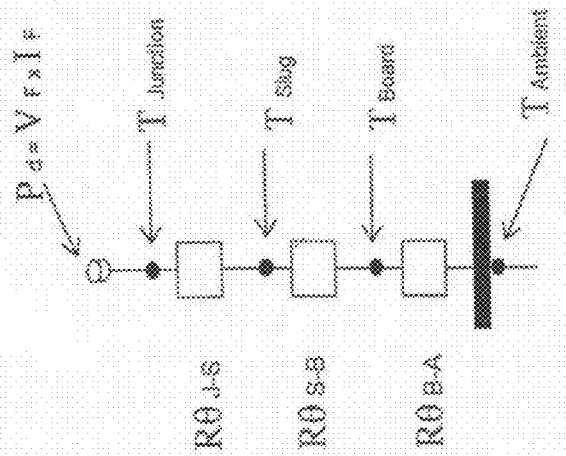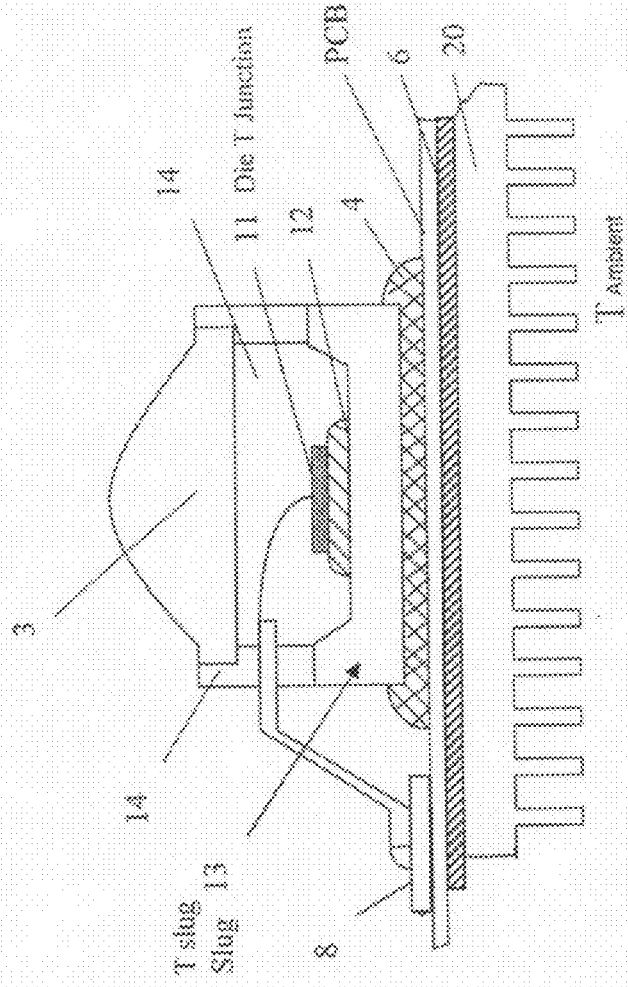
Fig 2-1 (PRIOR ART)
Fig 2-2

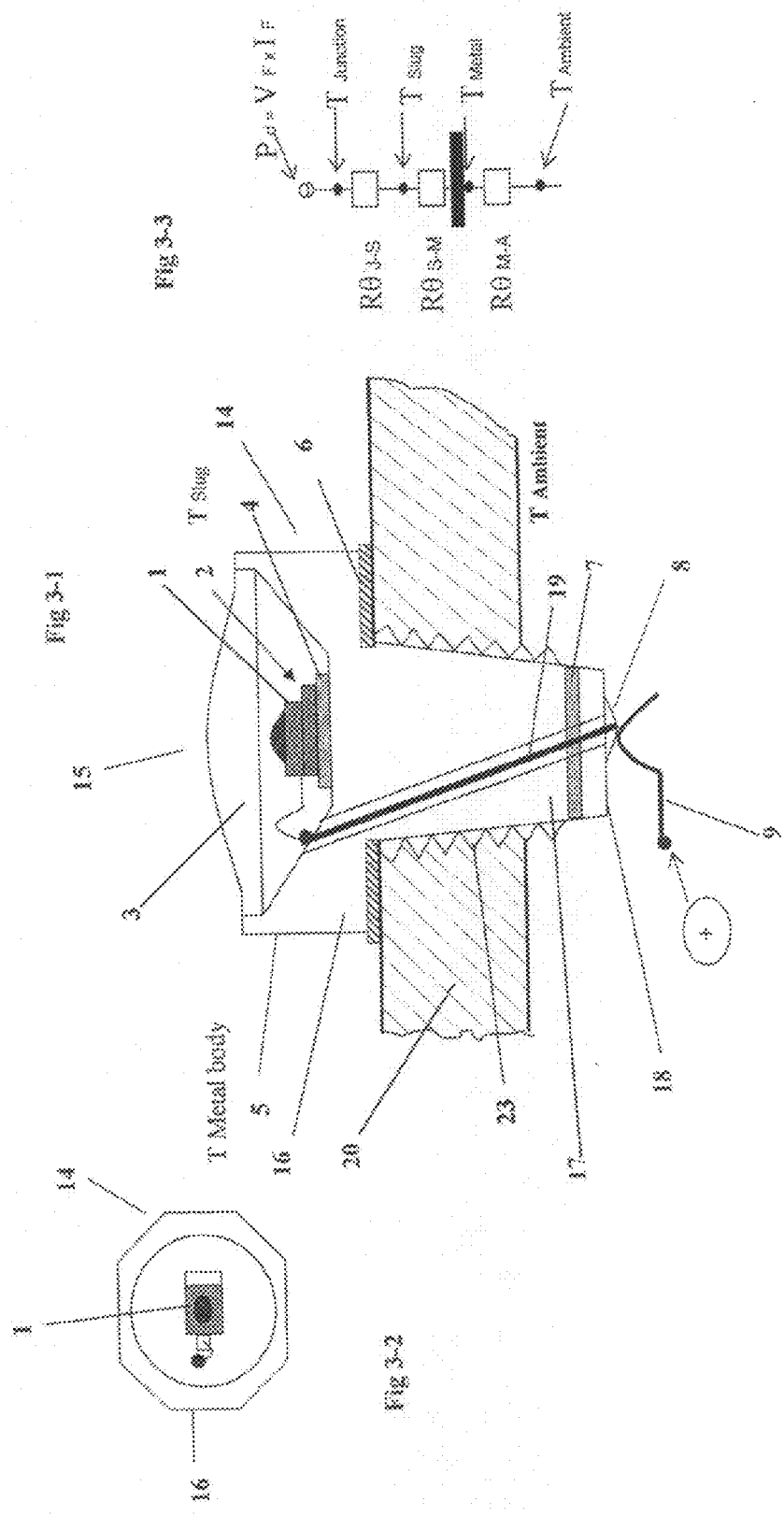

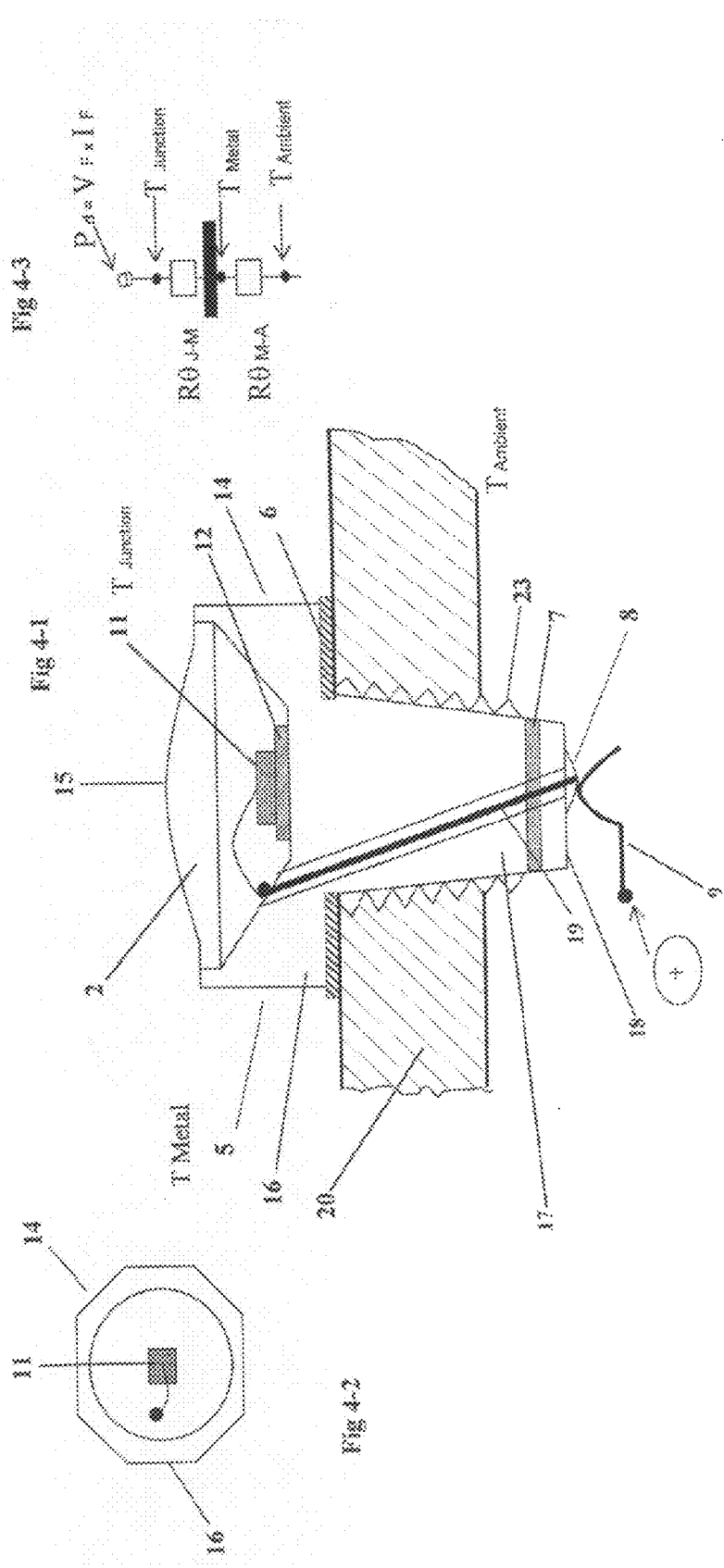

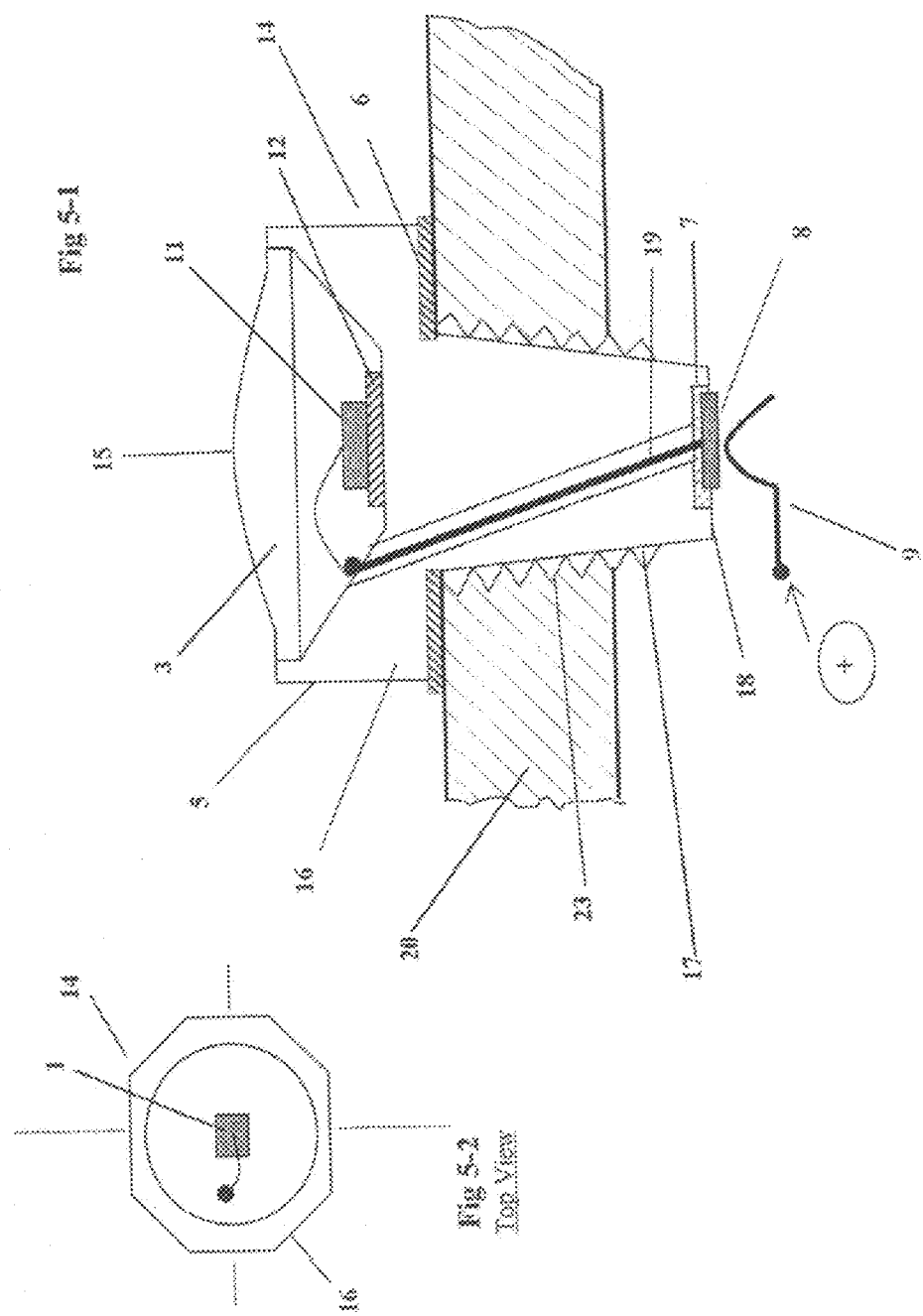

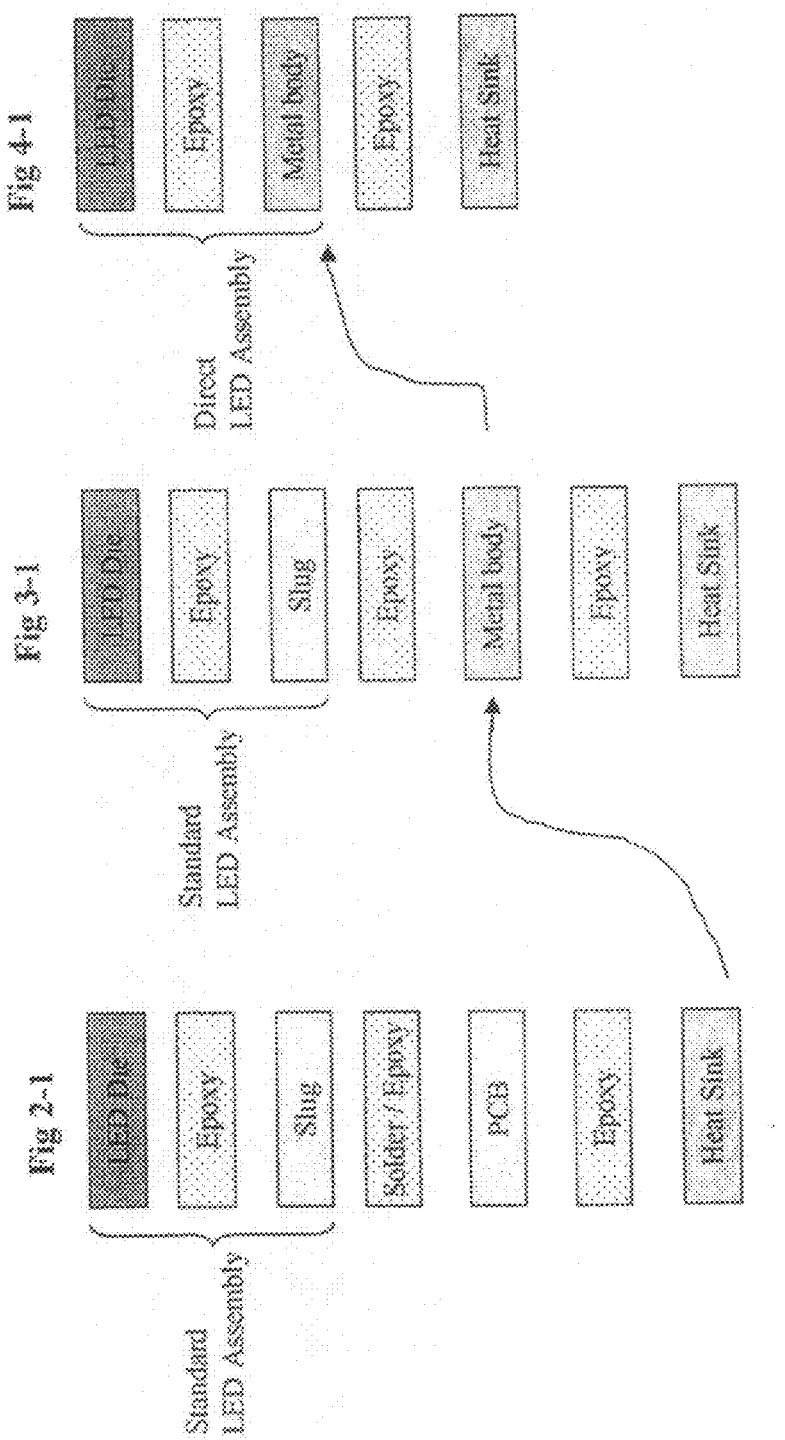

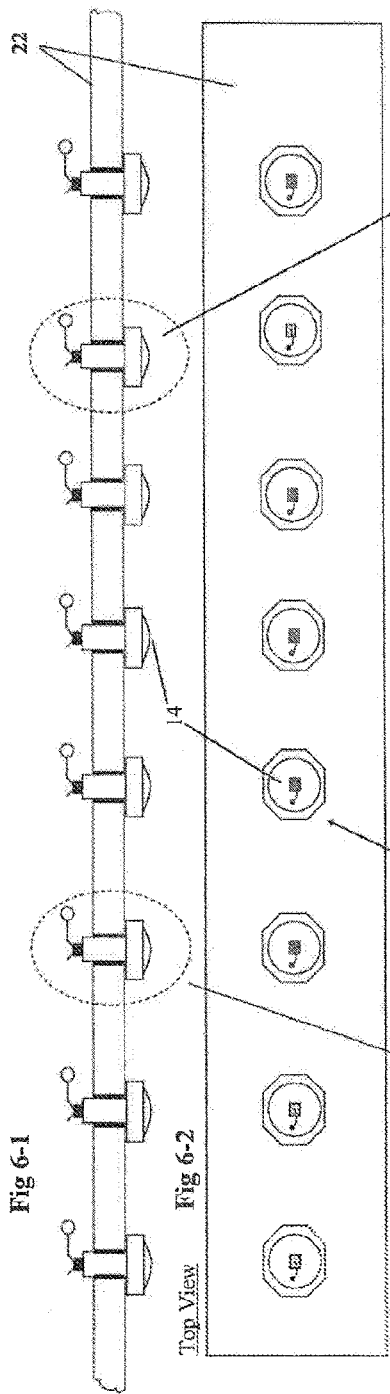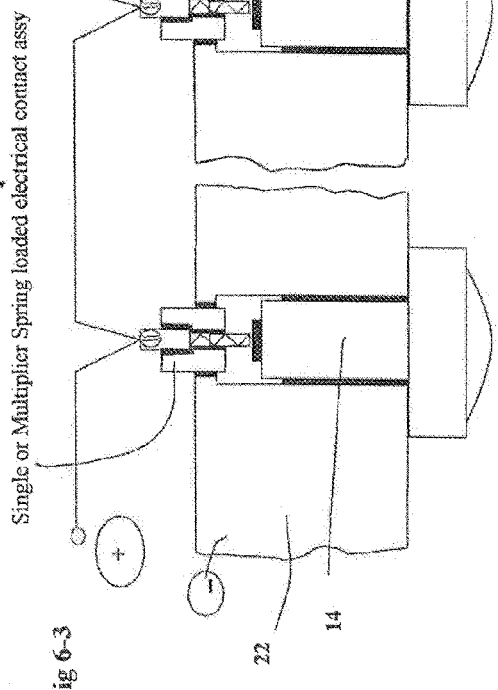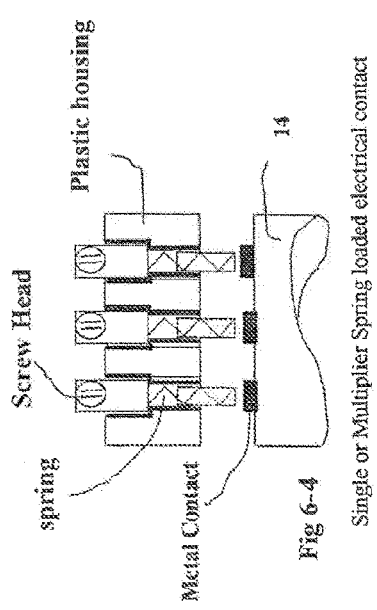

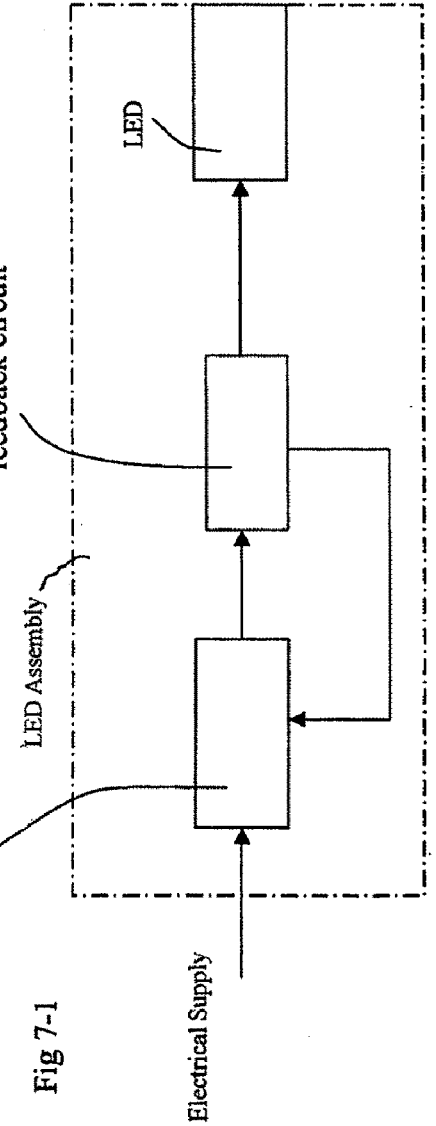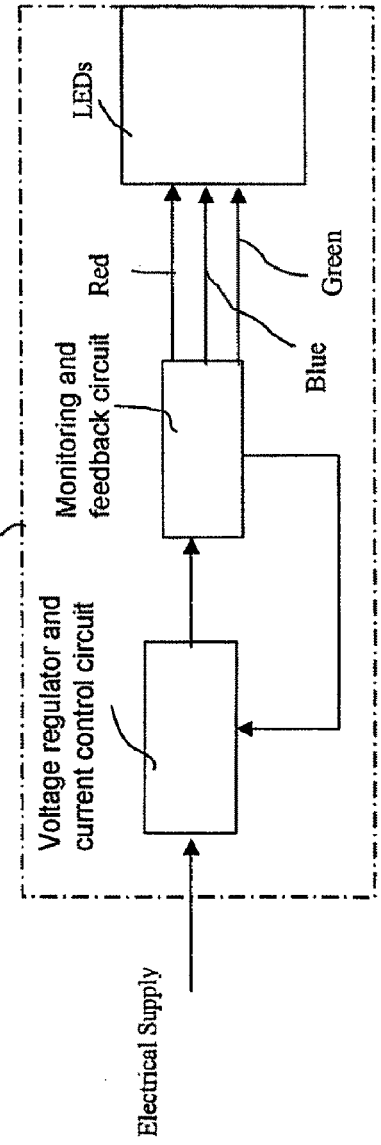

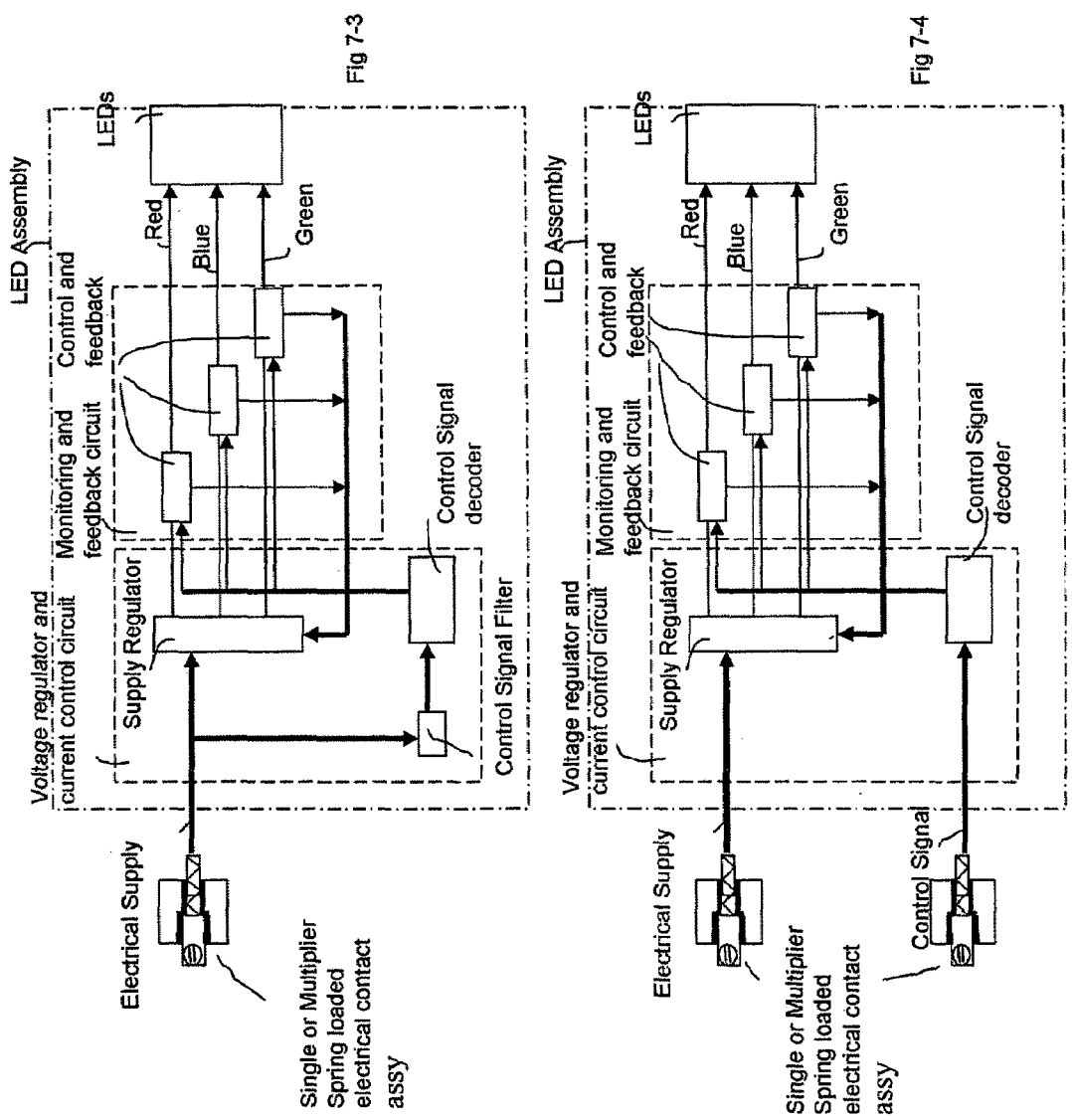

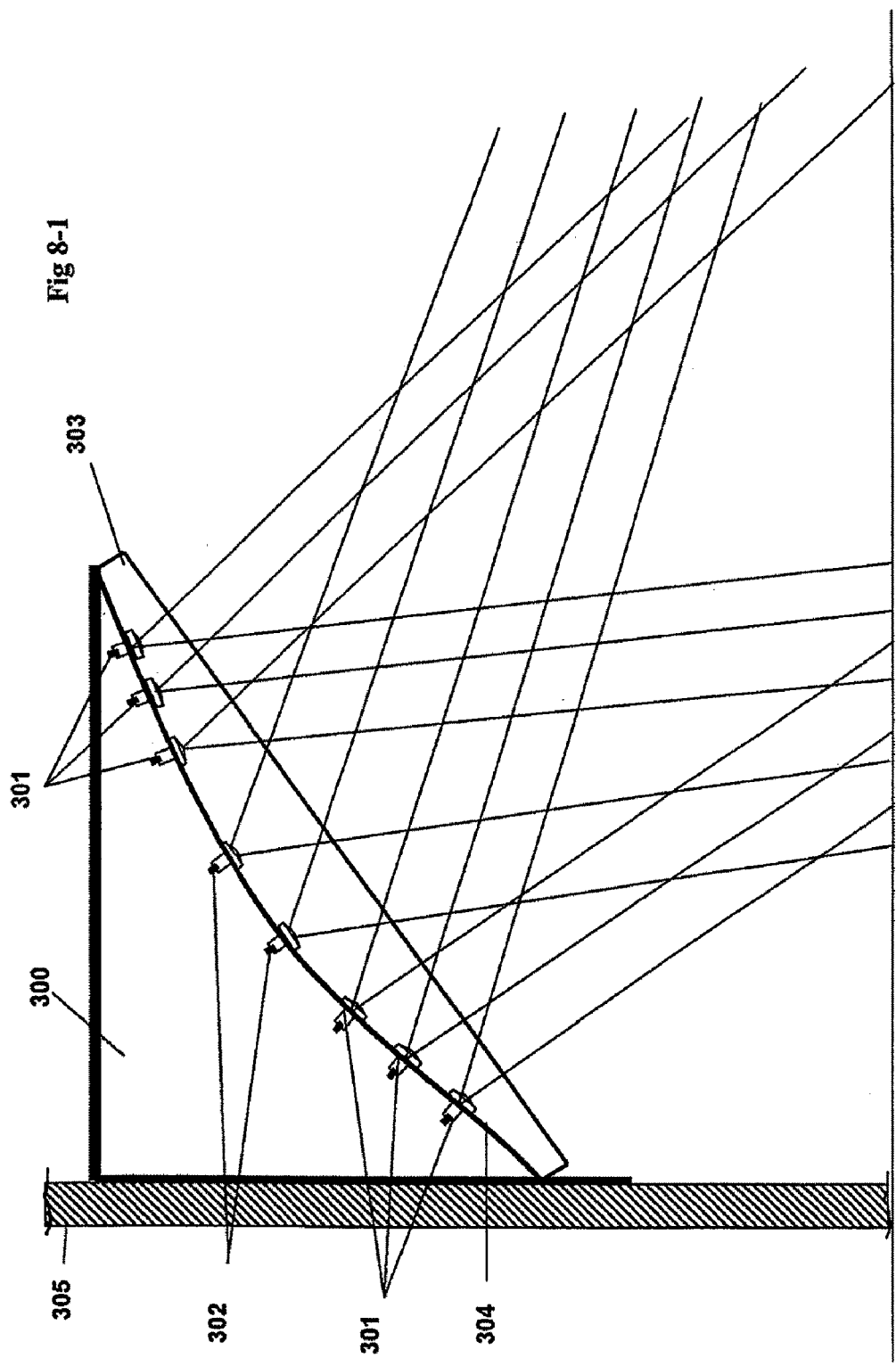

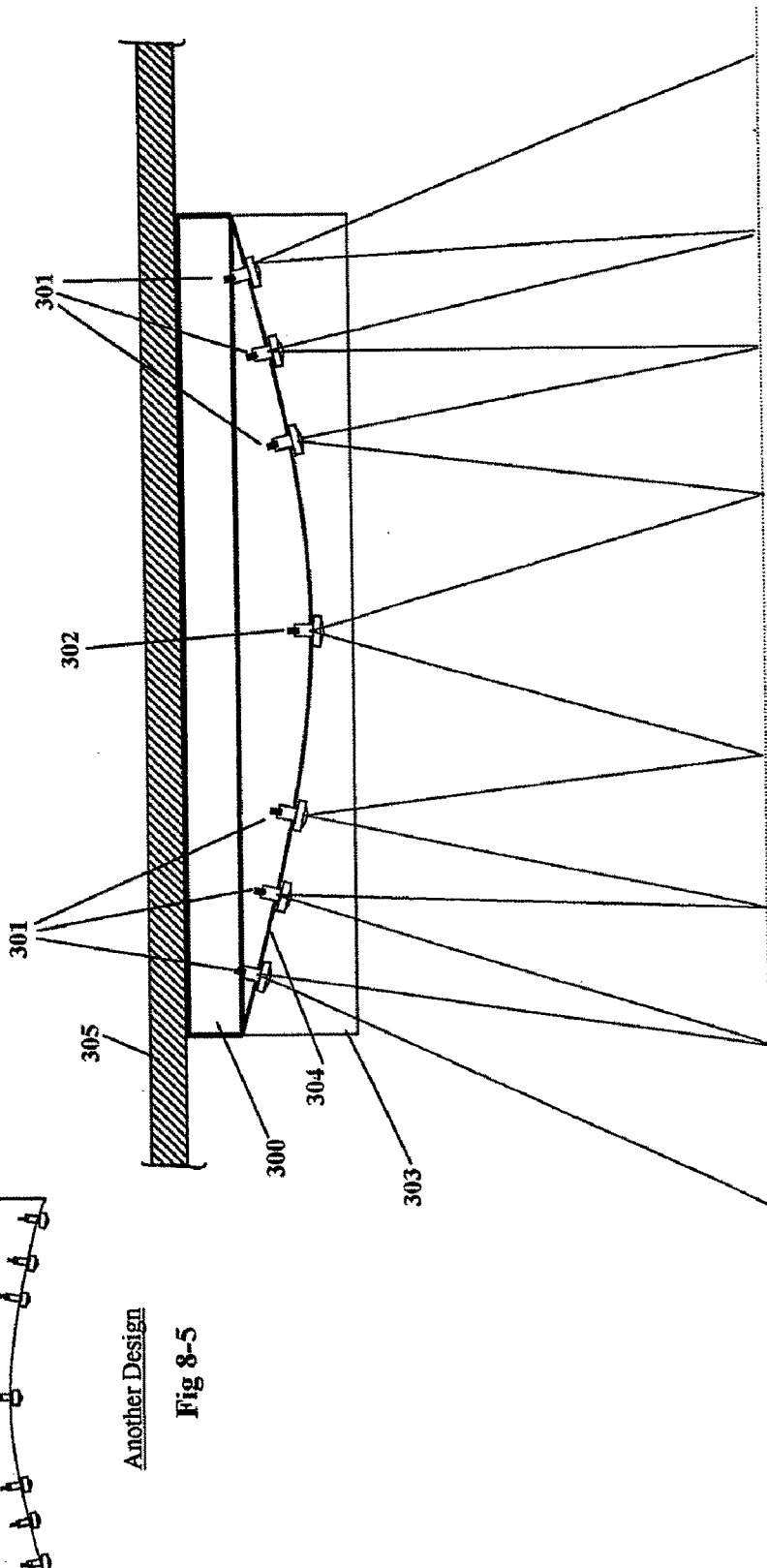

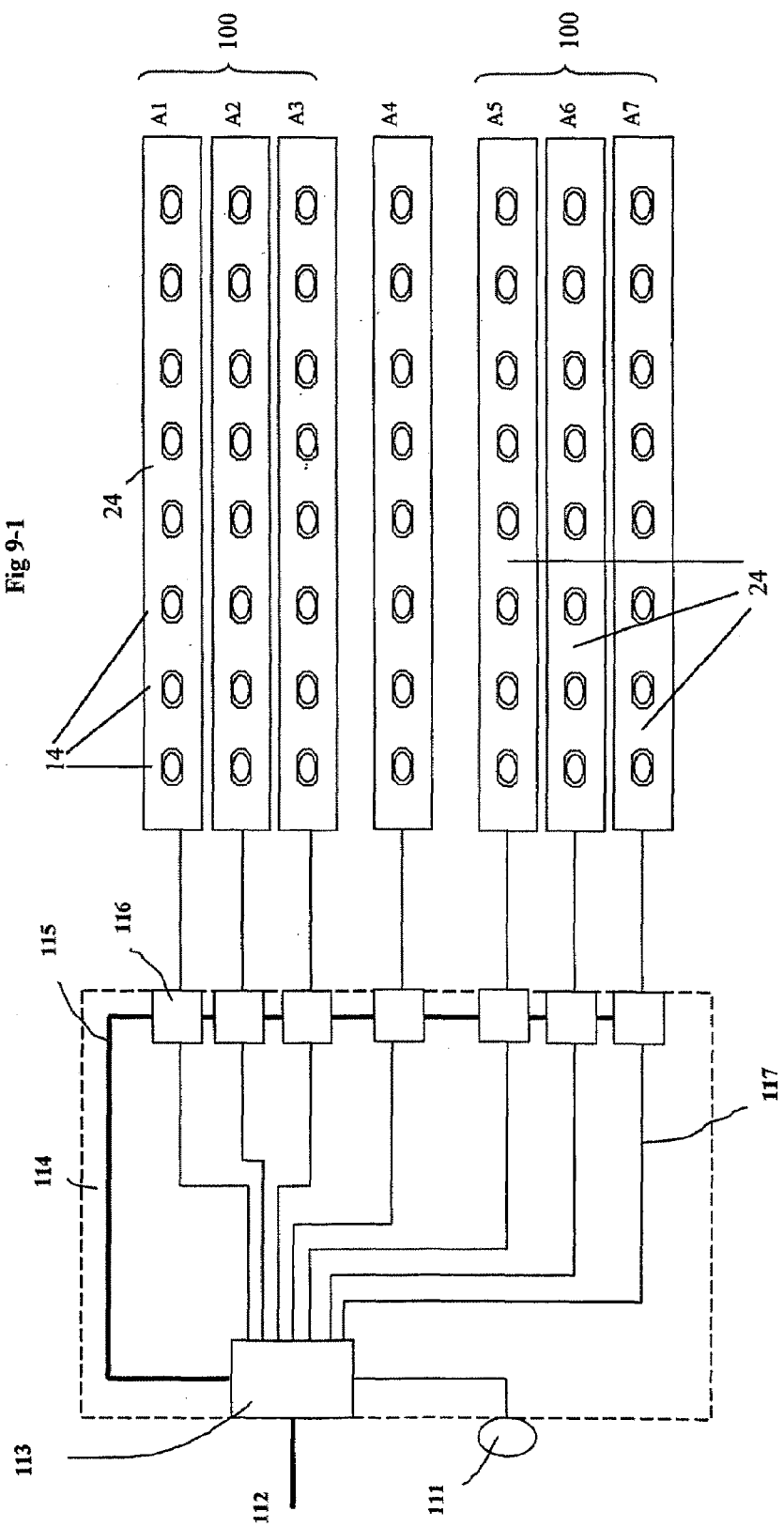

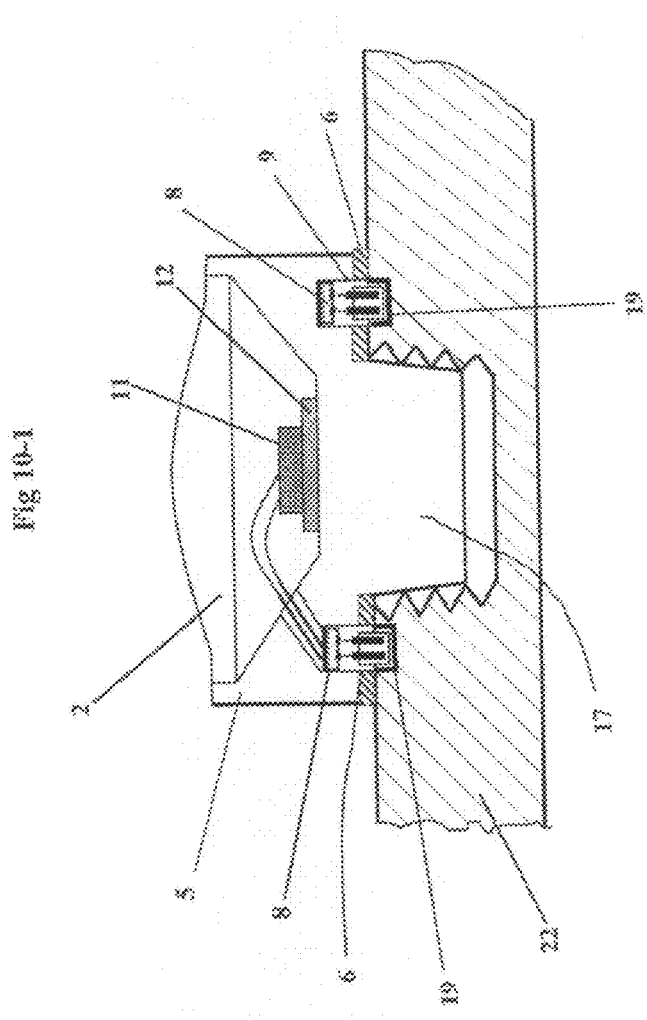
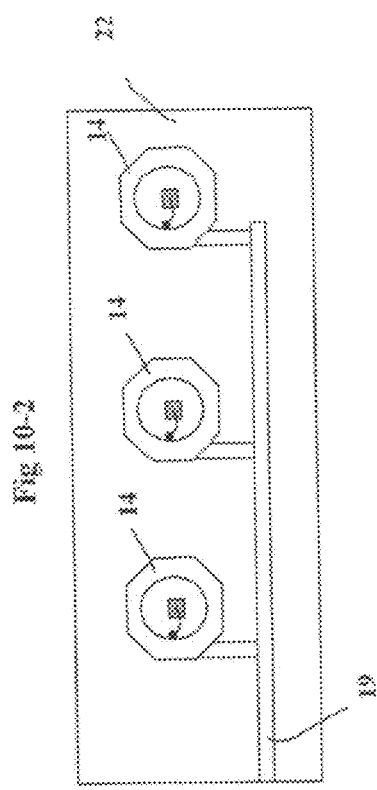
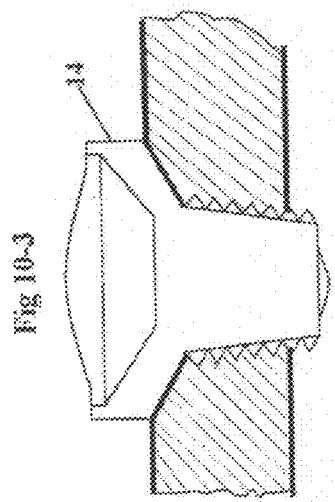
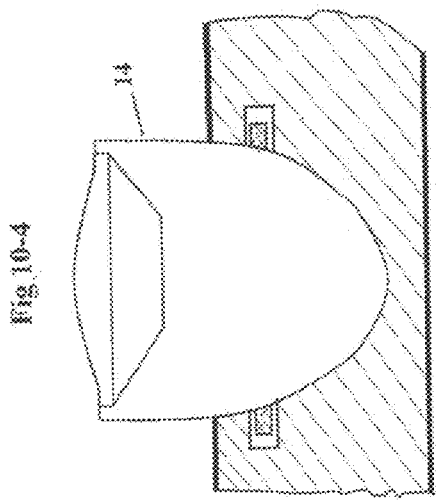

US 7,796,030 B2

LED HOUSING

This application is a divisional of U.S. Ser. No. 11/605,753 filed Nov. 29, 2006, now U.S. Pat. No. 7,549,773, the disclosure of which is incorporated herein by reference.

TECHNICAL FIELD

The invention relates to an improved High Brightness (HB) light emitting diode (LED) assembly and method of manufacture of the same and improved HB LED assembly which offers more efficient luminance.

BACKGROUND

Light Emitting diode (commonly referred to as "LED") is a type of semi-conductor device which converts electricity to light by using a characteristic of a compound semiconductor. An operation of the LED is given herein. When a forward voltage is applied to a semi conductor of a specific chemical element, electrons and holes are recombined with each other while moving through a positive-negative junction. The recombination of the electrons and the holes causes the energy level to fall down, thereby emitting light. LED are generally manufactured in small sizes, typically 0.25 mm$^2$ and mounted in a housing or packaging. The LED packaging is then mounted on a lead frame or printed circuit board using an epoxy mold. LED gives out light in different colours depending on the wavelength obtained from combination of elements constituting the semiconductor chip.

Most LED packaging or LED housing today are only suitable for low power or general decoration LED and the packaging design has not changed very much over these years.

LEDs that are designed to emit light in the visible spectrum generate a significant amount of heat, e.g., approximately 80-90% of the input energy received by the LED is converted to heat, with the remainder converted to light. Accordingly, the heat that is generated by the LED must be dissipated.

The thermal problem on HB LED (High Brightness Light Emitting Diode) is therefore always a concern. As the output power of the HB LED is getting higher (5 Watts, 8 Watts), care must be taken to ensure the heat generated by the semiconductor junction does not go beyond its maximum allowable junction temperature.

The HB LED provide several thousand hours longer life time than traditional lighting source. However, its life span can be changed very much if the heat produced is not adequately dissipated.

The inventor has proposed an improved LED housing and method of manufacture which can overcome the problem of heat dissipation. The improved LED also offers quick and easy installation and removal of the LED housing. The improved LED can also be arranged in such a manner as to offer constant illumination.

With the break through of this invention, the improved LED would change the design and use of traditional lighting appliances design, and have many applications making the invention more efficient and energy saving, hence more environmental friendly.

SUMMARY OF THE INVENTION

A first object of the present invention is to provide a LED housing and the manufacturing method thereof, which has improved heat dissipation properties.

A second object of the present invention is to provide a LED housing which can be easily fitted into a socket in a Printed Circuit Board which acts as a heat sink by screwing the LED housing into the heat sink and likewise be easily removed thereform from the heat sink by unscrewing the said LED housing.

A third object of the present invention is to provide a LED housing which can be fitted with one or two or three or more LEDs and in which said LED housing can be fitted with electrical contact and electrical circuits to receive and send electrical and electronic signals therefore acting as an intelligent LED.

A fourth object of the present invention is to provide a LED Housing which can be assembled into panels of LED housing thereby allowing the LED panels to be operated and controlled as advertisement boards or electronic boards and the like.

A fifth object of the present invention is to provide assemblies of LED housing of this invention which offers consistent luminance and illumination over a large area.

More specifically, a first aspect of the invention is a high power LED Housing consisting of one or more LED to form a LED assembly; a metal body; said metal body having a top, an upper portion having a gripping means, a lower portion and a base; wherein the LED assembly is mounted, and a lens fitted onto the top of the metal body, said lower portion having a fitting means on its exterior; said LED assembly connected by electrical wire to a base of the metal body; the base of the metal body having an electrical contact; wherein the LED housing can be installed on a bigger metal plate acting as a heat sink by fitting the said LED housing into a socket in the heat sink, said socket shaped to receive the lower portion of said LED housing and said LED housing removed from the heat sink by unfitting it from the socket.

Preferably the LED housing is fitted into the heat sink by using the gripping means to turn or twist said LED housing to fit into the shaped socket and said LED housing is unfitted from the heat sink by using the gripping means to turn or twist said LED housing to remove it from the shaped socket.

Preferably, the LED assembly is mounted on a slug, said LED assembly and slug mounted on a base of a lens with epoxy resin. Preferably, the LED assembly is a die mounted on a base of a lens with die resin.

Advantageously, the LED assembly can be a Red color LED or a Green color LED or a Blue Color LED.

Advantageously, the LED assembly can be a Red color LED and a Green color LED or Red color LED and a Blue Color LED or a Green color LED and a Blue Color LED.

Advantageously, the LED assembly can be a Red color LED, a Green color LED and a Red color LED.

Preferably, the metal body for the high power LED housing has an upper portion and a lower portion in the form of a T shaped bolt, the upper portion having a number of sides formed as a gripping means.

Advantageously the metal body is cylindrical shaped with a round cross section, said metal body having an upper portion adapted as a gripping means.

Advantageously, the metal body is in the form of a button mushroom which a wider mushroom shaped top and a narrow lower portion, said wider mushroom shaped top adapted as a gripping means.

Preferably, the metal body for the high power LED housing has fitting means which consists of circular screw threads.

Advantageously, the metal body for the high power LED housing has fitting means which consist of a snap on.

Preferably, the LED assembly is connected by electrical wire to the electrical contact at the base of the metal body, wherein the electrical contact includes a circuit board and when installed into the heat sink, is connected thereto to a electrical power source to light up the LED assembly.

Preferably, the LED assembly is connected by electrical wire to the electrical contact, wherein the electrical contact is located at the base of the LED housing.

Alternatively, the LED assembly is connected by electrical wire to the electrical contact, wherein the electrical contact is located at the undersurface of the upper portion of the LED housing.

Alternatively, the LED assembly is connected by electrical wire to the electrical contact, wherein the electrical contact is located at the side of the upper portion of the LED housing.

Preferably, the circuit board consists of a voltage regulator, current control circuit and monitoring and feedback circuit.

Advantageously, the circuit board consists of a voltage regulator, current control circuit and monitoring and feedback circuit and temperature sensor.

Advantageously, the LED assembly is connected by electrical wire to the electrical contact at the base of the metal body, and said electrical contact includes a circuit board consists of a voltage regulator, current control circuit and monitoring and feedback circuit and temperature sensor and when installed into the heat sink, the LED assembly is connected thereto to a electrical power source so that performance of the LED assembly can be monitored from a remote maintenance center and if the LED assembly fails, its failure could be transmitted to the remote maintenance center for maintenance action.

Advantageously, the circuit board consists of a voltage regulator, current control circuit and monitoring and feedback circuit, temperature sensor and having additionally a motion sensor and a resistor so that when installed into the heat sink, the LED assembly is connected thereto to an electrical power source whereupon if there is no movement, the high power LED housing will be partially bright and if the motion sensor detects the presence of movement of surrounding objects, said motion sensor will activate the circuit board to fully turn on the high power LED housing and upon the cessation of movement, the high power LED hosing will once again be partially bright.

Advantageously, the circuit board consists of a voltage regulator, current control circuit and monitoring and feedback circuit, temperature sensor, a motion sensor, resistor, a microcontroller and a wireless communication link so that when installed into the heat sink, the LED assembly is connected thereto to a electrical power source and if there is no movement, the high power LED housing will be partially bright and when the motion sensor detects the presence of movement of surrounding objects, said motion sensor will activate the circuit board to turn on the high power LED housing and at the same time, said microcontroller will activate the wireless communications link to send a signal to the adjacent forward high power LED housing to brighten up, in accordance to predetermined algorithms so that the LED housing ahead of the moving object would gradually brighten while those LED housing behind the moving object would gradually return to its partial brightness state.

Preferably, the motion sensor could be an infrared detector which detects the presence of a living object by the heat generated from the living object.

Alternatively, the communication link can be RF wireless or Infrared or Power Supply line communication or even the High Power LED light beam itself.

Preferably, the base of the LED housing has a single or multiplier spring loaded electrical contact assembly, for contact with the electrical circuit.

A second aspect of the invention is a plurality of LED housing arranged in a linear pattern to form a LED panel, said plurality of LED housing being connected to an electrical circuit consisting of a voltage regulator, current control circuit, a monitoring and feedback circuit, power regulator and light sensor control unit so that feedback on the performance of the LED are transmitted to a control center so that electronic signals could be in turn transmitted to the LED housing so that LED light source can be controlled to give colored patterns of LED lights to form an electronic image in the form of an advertisement.

Preferably, the LED light source consisting of a plurality of LED housing is arranged in a linear pattern on a reflector to form a panel of LED to provide a more efficient luminance distribution.

Preferably, the LED light source is arranged in a linear pattern on a curved concave reflector to form one or more wide angled LED array and one or more narrow angle LED array to provide a more efficient luminance distribution.

Preferably, the LED light source is arranged in a linear pattern on a curved convex reflector to form one or more wide angled LED array and one or more narrow angle LED array to provide a more efficient luminance distribution.

Preferably, the LED light source is arranged in a linear pattern on a flat reflector consisting of one or more wide angled LED array and one or more narrow angle LED array to provide a more efficient luminance distribution.

Preferably, the LED light source is arranged in a linear pattern on a reflector, wherein the LED housing are connected to an electrical circuit consisting of a voltage regulator, current control circuit, a monitoring and feedback circuit, power regulator and light sensor control unit so that sufficient numbers of LED are turned on in the LED light source to suit the light conditions as determined by the light sensor control unit.

Preferably, the LED light source has an UV cover for the LED panels which acts as an UV light filter to prevent excess UV light from leaking into the surrounding.

The above objects as well as other objects would be apparent once a more complete understanding of these and other features and advantages of the invention have been achieved upon a careful consideration of the following detailed description of certain embodiments illustrated in the accompanying drawings.

DRAWINGS

FIGS. 1-1 and 1-2 is an example of LED housing of the prior art and the heat dissipated at various parts of the LED.

FIGS. 2-1 and 2-2 is another example of LED housing of the prior art showing the LED assembly mounted on an expensive MCPCB (metal-Core Printed Circuit Board) and the heat dissipated at various parts of the LED.

FIGS. 3-1, 3-2 and 3-3 shows a first embodiment of the LED housing of this invention, a top view and the heat dissipation at various locations of the LED.

FIGS. 4-1, 4-2 and 4-3 shows a second embodiment of the LED housing of this invention, a top view and the heat dissipation at various locations of the LED.

Figures 3, 8:
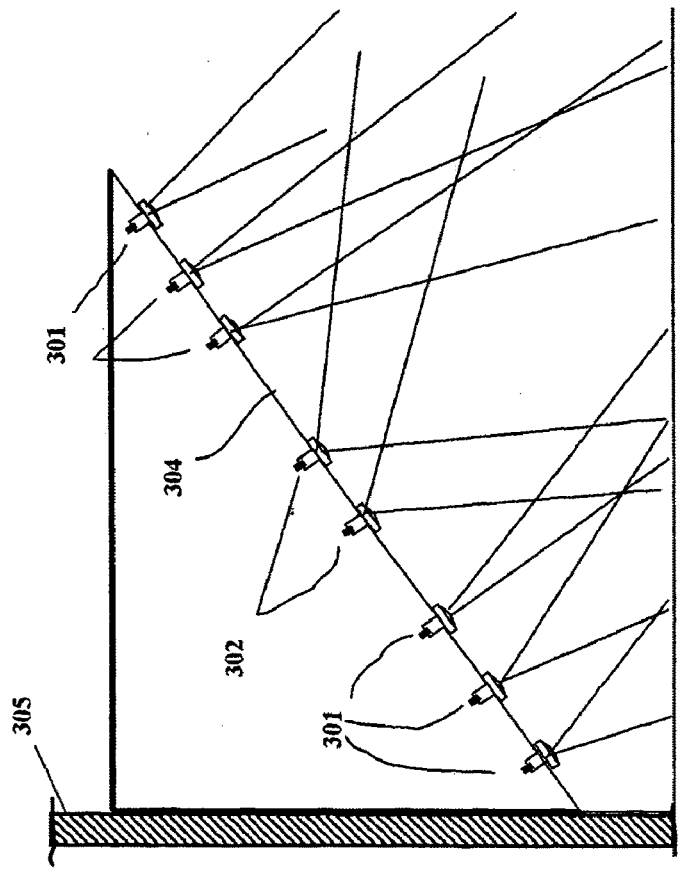
Figures 2, 8:
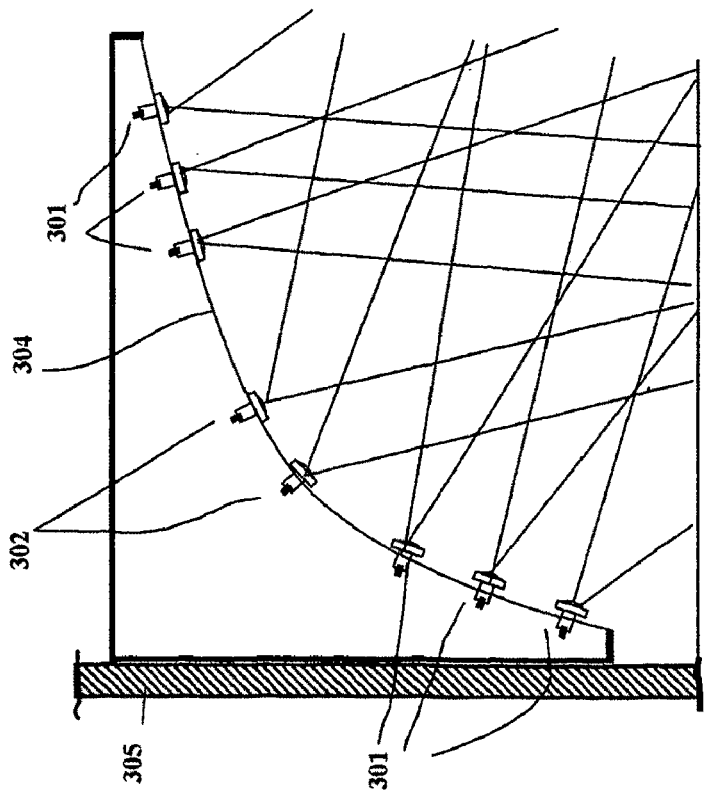

FIGS. 5-1, and 5-2 shows a third embodiment of the LED housing of this invention and a top view of the third embodiment.

FIG. 5-3 shows a layer diagram and gives a comparison of the cross section of the LED of the invention and prior art LEDs and heat dissipation through the LED housing of the prior art and of the invention.

FIGS. 6-1, 6-2, 6-3 and 6-4 shows the electrical contacts of an array of LED housing fitted into the Circuit board forming a panel of LED.

FIGS. 7-1 and 7-2 are close up of the electrical connection of the LED housing fitted into the panel for LED of FIGS. 6-1 and 6-2.

FIGS. 7-3 and 7-4 are electrical circuits for LED housing for intelligent working and control of LED panel.

FIGS. 8-1, 8-2, 8-3, 8-4 and 8-5 are proposed embodiments of improved LED panels which provide a more efficient luminance compared to LED panels of prior art.

FIG. 9-1 is an electrical circuit for improved LED panel of FIGS. 8-1, 8-2, 8-3 and 8-4 of the invention.

FIG. 10 shows various embodiments of the LED housing.

DETAILED DESCRIPTION OF PREFERRED EMBODIMENTS

FIGS. 1-1 and 1-2 is an example of LED housing of the prior art and the heat dissipated at various parts of the LED housing.

In the prior art illustrated in FIG. 1-1, a LED assembly 1 consists of a die 11 and a slug 13. The die 11 is mounted on the slug 13 by a die epoxy 12 to form a LED housing or LED package. The LED housing 14 is mounted directly on a Metal-core Printed Circuit Board ("MCPCB") 22 by mean of high temperature epoxy or resin. The LED housing is affixed using thermal epoxy onto the MCPCB 22 which is mounted on a Heat Sink 20 for direct heat dissipation.

FIGS. 2-1 and 2-2 is another example of a LED housing 14 of the prior art showing the LED assembly 1 mounted on an expensive MCPCB (metal-Core Printed Circuit Board) 20 and the heat dissipated at various parts of the LED housing.

In the prior art illustrated in FIG. 2-1, a LED housing or packaging 14 consists of a die 11, a slug 13, a package and lens 3. The die is mounted on the slug ('the LED assembly') by a die resin 12. The die 11 and slug 13 is fitted with a lens 3 by means of encapsulating resin (forming the LED housing or LED package). The LED housing 14 is then mounted directly on a expensive MCPCB (metal-Core Printed Circuit Board) by soldering means. The electrical contact 8 of the LED housing is also soldered onto the MCPCB. The MCPCB is in turn mounted on a heat sink by thermal epoxy.

It can be seen that the method of mounting used in the prior art affords little flexibility since the LED housing are permanently mounted. The method of mounting of the LED housing or LED package of the prior art is also time consuming. If a LED assembly should fail, removal of the failed LED assembly within the LED housing poses some difficulty. Also no preventive maintenance could be carried out at all due to the inflexible method of mounting. In both illustrations of the LED assembly of the prior art, $$\text{Thermal Resistance} = R\theta_{Junction-Ambient} = \frac{\Delta T_{Junction-Ambient}}{P_d}$$

Where

ΔT=T Junction−T Ambient (deg C)

P d=Power dissipated (w)

=Forward current (IF)×Forward voltage (V F)

Rθ Junction-Slug (J-S)=Rθ from Die to Die epoxy and to slug material.

Rθ Slug-Board (S-B) Rθ from epoxy between slug and board to board (MCPCB) material.

Rθ Board-Ambient (B-A)=Rθ from adhesive between the head sink and the board to the head sink into ambient air.

ΔT=T Junction−T Ambient (deg C) is therefore a summation of P d and Rθ.

FIGS. 3-1, 3-2 and 3-3 shows respectively a top view and the heat dissipation at various locations of a first embodiment of the LED housing of this invention.

FIG. 3-1 shows a cross section of a high power LED housing 14 of the invention mounted directly on a Metal body 5 by means of high temperature epoxy or resin 6. The high power LED Housing 14 consists of a metal body 5 on which the lens 3 and LED assembly 1 is mounted. The lens 3 may be made of material which is transparent or opaque or transfusion or optically focused. One color LED or two color LED or three or more color LED are mounted on a slug 2 on top of the base 18 of the lens using solder or epoxy resin 4 to form the LED assembly 1. The metal body 5 has a top 15 on which the lens 3 is fitted, an upper portion 16 and a lower portion 17 and a base 18. The lower portion 17 of the LED housing 14 has threads on its exterior surface for screwing the said LED housing 14 into a socket 23 and unscrewing said LED housing 14 from the socket 23. The LED assembly 1 is connected by electrical wire 19 to the base 18 of the metal body.

The base 18 of the Metal body of the LED housing 14 in turn has electrical contacts with a circuit board 8 and insulation 7. By virtue of the proximity between the lower portion 17 of the Metal body of the LED housing and the bigger metal plate 22 or heat sink, more and faster direct heat dissipation is obtained. Since the base 18 of the metal body of the LED housing has electrical contact 8, the LED housing 14 could be readily and easily fitted into a socket built into the circuit board by way of fitting its lower portion into a socket 23 built into the heat sink 20. The circuit board (partially shown in FIG. 3-1) could be in turn pre-assembled with electrical and electronic circuits, for ready contact with the electrical contact of the LED housing. The metal body 5 of the LED housing is mounted on the heat sink with thermal epoxy.

The number of Electrical contacts 8 in the base of the LED housing 14 could be more that one, depending on number of LEDs to be placed inside the LED assembly 1. Consequently, the number of spring electrical contacts 9 in the circuit board for a LED housing could be more than one, depending on the number of LEDs packed into the LED assembly 1 of the LED housing 14.

FIGS. 4-1, 4-2 and 4-3 shows a second embodiment of the LED housing of this invention, a top view and the heat dissipation at various locations of the LED housing and heat sink.

FIG. 4-1 shows a cross section of a high power LED housing 14 mounted directly on a Metal body 5 by means of high temperature epoxy or resin 6. The high power LED Housing 14 consists of a metal body 5 on which the lens 3 and die 11 is mounted. The die 11 is mounted on the base of the lens 3 with die resin 12 and connected to electrical wire leading to the base 18 of the metal body. The base 18 of the Metal body of the LED housing 14 in turn has electrical contacts 8 and insulation 7. The lower portion 17 of the Metal body 5 of the LED housing has threads so that the LED housing 14 can be screwed directly into a socket 23 built into a bigger metal plate or Heat Sink 20 for direct heat dissipation. Since the base 18 of the metal body of the LED housing has electrical contact, the LED housing 14 could be readily and easily fitted into a socket in the circuit board. The circuit board is in turn pre-assembled with spring electrical contact and other circuits, for ready contact with the LED housing of the invention. The metal body 5 of the LED housing 14 is mounted on the heat sink 20 with thermal epoxy 6.

FIGS. 5-1, and 5-2 shows a third embodiment of the LED housing of this invention and a top view of the third embodiment.

FIG. 5-1 shows a cross section of a high power LED housing 14 mounted directly on a heat sink 20 by means of high temperature thermal epoxy 6. The high power LED housing 14 consists of one or more color LED mounted by die resin 12 to form a LED assembly 1. The LED assembly 1 is mounted on a die resin 12 with a lens 3 fitted on a metal body to form the LED housing 14. The LED assembly 1 is connected to electrical wire 19 leading to the base 18 of the metal body. The base 18 of the Metal body of the LED housing 14 in turn has electrical contacts 8 and insulation 7 which would connect with the electrical circuit in the heat sink. The lower portion 17 of the Metal body of the LED housing has threads so that the LED housing 14 can be screwed directly into a bigger metal plate or Heat Sink for direct and more efficient heat dissipation. Since the base 18 of the metal body of the LED housing 14 has electrical contact 8, the LED housing 14 could be readily and easily fitted into a socket 23 in the heat sink 20 which is connected to other electrical circuits. The metal body 5 of the LED housing 14 is mounted on the heat sink with thermal epoxy 6.

Although the LED housing 14 has been described as having an electrical circuit, it is possible that a circuit board (not shown) in the heat sink has pre-assembled spring electrical contact and additional circuitry, for ready contact with the LED housing 14 of the invention.

FIG. 5-3 shows a comparison of the thermal path to the heat sink between a standard LED housing of the prior art (embodiment "A", which is the embodiment of FIG. 2-1) and a LED housing of the first embodiment (embodiment "B", which is the embodiment of FIG. 3-1) and second embodiment (embodiment "C", which is the embodiment of FIG. 4-1). In both embodiments of the invention, the LED assembly 1 is nearer the metal body of the LED housing 14 which in turn is nearer the heat sink 20. The heat from the LED assembly 1 in the LED housing 14 of the invention is therefore dissipated downwards to the heat sink in a relatively shorter distance. The thermal path of the prior art is however longer. In the case of the first embodiment and second embodiment, the heat dissipation is much improved as shown in this formula:

$$P_d = V_F \times I_F$$

FIGS. 6-1, 6-2, 6-3 and 6-4 show the ease of fitting of electrical contact of a plurality of LED housing on a Circuit board to form a panel of LED housing (referred to as 'LED panel'). Each LED panel 24 may be formed into a plurality of LED panels to form an array of LED panels. The light from a number of LED arrays could be powerful enough to act as a lamp for instance as a street light. It is also possible to have more than one type LED housing mounted, for example an array of housing of Red LED, Blue LED and Green LED (or any available color LEDs). Since one inventive feature of the LED housing 14 is its electrical contacts 8 at the base of the LED housing, which is designed such that when screwed or inserted onto the circuit board, contact is readily made since all contacts are preset with marked alignments.

Since the lower portion 17 of the LED housing has threads, the LED housing 14 can be easily screwed into the metal base plate 22 to form a LED panel 24. Likewise, if one of the LED assembly 1 fails, the LED housing 14 can be easily unscrewed from the LED panel 24 and a new LED housing 14 screwed in, to replace the failed LED assembly 1. With the use of a plurality of LED housing to form a LED panel and with a number of LED panels arranged to form a LED array, it is permissible for a few LED assemblies to fail without affecting the luminance of the LED arrays. With the electrical and electronic circuit proposed, preventive maintenance and replacements of LED housing could be carried out since it is possible to obtain data on the performance of the LED housing.

The shape of the LED housing 14 of this invention may be resemble the shape of a T-shaped bolt like FIG. 3-2, 4-2, 5-2. The metal body of the LED housing has an upper portion having a number of sides formed as a gripping means. The lower portion of the LED housing is the vertical portion of the T shaped bolt shaped to be fitted into a similar shaped socket. Alternatively, the metal body of the LED housing could be cylindrical shaped with a round cross section wherein the said metal body has an upper portion adapted as a gripping means. It is also possible that the metal body of the LED housing be in the form of a button mushroom with a wider mushroom shaped top and a narrow lower portion, and the wider mushroom shaped top adapted to form a gripping means.

If the LED is T-shaped bolt, a traditional Bolt Socket tools kit may used for tightening and loosening the LED housing 14 thereby providing a very convenient way to fit the LED housing 14 of this invention. Alternatively, it may be customized as a "Star" shape, using special star shaped "Bolt socket" to install or remove the LED housing 14 and consequently any failed LED assembly 1. The special star shaped design is designed also to prevent unauthorized access to this installation. The shape of the LED housing may also resemble an elongate cylinder in which the LED housing can be pushed into a U-shaped socket and locked by turning the said elongate cylindrical housing. The shape of the LED housing could also resemble a button mushroom in which the button mushroom head contains the LED assembly and the base is inserted into the socket of the heat sink and snapped to lock said housing. Whatever the shape of the LED housing, the shape is to facilitate easy insertion and removal of said LED housing while ensuring the said LED housing is securely received in the socket during use. Whatever the shape of the LED housing, a LED housing removal and installation tool could be adapted to install and remove the shaped LED housing.

This invention provide low maintenance cost, each LED housing in the invented panel or array can be assembled and dissembled individually without changing the whole LED panel like traditional way (such as in FIG. 6-1). The series of LED array can be formed for many uses, based on application needs (as represented in FIG. 6-1, 8-1, 9-1).

Since the base 18 of the LED housing 14 has electrical contacts and likewise the metal plate 22 of a LED panel has sockets for mounting of the LED housing 14 which are connected to electrical wires for supply of electricity, failure of any LED assembly is a matter of simply unscrewing (or unlocking or turning, as the case may be) and removing the failed LED and inserting or screwing in a fresh LED housing 14 with a fresh LED assembly 1. Since electrical contacts are available within the LED housing and the metal plate, it would be easy for an electrical circuit to be built into either the LED panel and heat sink to control the operation of a LED assembly within a LED housing. It is also easy for control signals to be passed to the LED assembly within the LED housing. It is therefore an inventive feature of the LED panel 24 to have electrical and electronic inputs so that the all the LED housing 14 arranged in a LED panel 24 can be formed into a LED panel 100. The LED panel 24 can be turned on and off in systematic patterns for many applications such as electronic advertisement boards and electronic information boards.

FIGS. 7-1 and 7-2 are the electrical circuit for the electrical contact fitted into the circuit board of the LED housing of the invention shown in FIGS. 3-1, 4-1 and 5-1.

The Electrical Contact may internally fitted in a Circuit board (FIG. 3-1 or 4-1 or the embodiment in FIG. 5-1), where it regulated the supply voltage and control amount of current into LED assembly 1, the brightness and amount of light emitted from the LED housing 14 formed from the LED Assembly 1 can be controlled and monitored. Consequently the brightness and amount of light emitted from a LED panel 24 can be controlled and monitored.

The circuit board could consists of a voltage regulator, current control circuit and monitoring and feedback circuit, temperature sensor and having additionally a motion sensor and a resistor so that when installed into the heat sink, the LED assembly is connected thereto to an electrical power source. If there is no movement immediately in the surrounding area under the motion sensor, the high power LED housing will be partially bright or even not turned on. If the motion sensor detects the presence of movement of surrounding objects, the motion sensor will activate the circuit board to fully turn on the high power LED housing. It is possible that upon the cessation of movement, the high power LED hosing will once again be partially bright or turned off.

It is envisaged that the circuit board could also consists of a voltage regulator, current control circuit and monitoring and feedback circuit, temperature sensor, a motion sensor, resistor, a microcontroller and a communication link. When the circuit board is installed into the heat sink, the LED assembly is connected thereto to a electrical power source. If there is no movement immediately in the surrounding area under the motion sensor, the high power LED housing will be partially bright or not even turned on. When the motion sensor detects the presence of movement of surrounding objects, said motion sensor will activate the circuit board to turn on the high power LED housing and at the same time, said microcontroller will activate the communications link to send a signal to the adjacent forward high power LED housing to brighten up a radius, in accordance to predetermined algorithms which for example could be:—

R+4

N+4 where R is the predetermined radius of a circle measured from the centre, which is the spot detected by the motion sensor, and 4 is the surrounding number of LED housing panels to light up.

Alternatively, the predetermined algorithm could be N+4 where N is the number of LED housing panels. Basically, the LED housing panels ahead would brightened as the object moves forward and the LED housing panels behind the moving object would grow dimmer. In the manner, the area of illumination for the moving object could be always around the area of the moving object.

Instead of a motion sensor, a infrared detector could be used. Alternatively, the communication link can be RF wireless or Infrared or Power Supply line communication or even the High Power LED light beam itself.

FIGS. 7-3 and 7-4 are electrical circuits for LED housing for intelligent working and control of a series of LED housing 14 making up a LED panel 24.

In FIG. 7-3, the LED assembly 1 (within the LED housing 14) has three LED such as Red LED, Blue LED and Green LED. The circuit board has a Voltage Regulator and Current Control Circuit and a Monitoring and Feedback Circuit, the latter provide feedback to the Voltage Regulator and Current Control Circuit, which may be using PWM (Pulse Width Modulation) or Liner control for closed loop control to make sure the amount of light emitted from the LED assembly 1 is under regulation. A Temperature sensor may also be built on board for monitoring the Metal Body temperature to ensure it is within safe operating range. This type of Circuit board provide an intelligent feedback control which will ensure the brightness of the LED array 100 formed from a series of LED panel 24 are consistent with change in its operating temperature and properties degrading due to LED life cycle, which also provide brightness alignment to the rest of the LED panels (as shown in FIGS. 6-1, and 8-1) for even and consistent distribution of illumination in a built up area.

The Electrical Contact may be a multiplier points (as in FIG. 7-4) where it may connected to Red, Green and Blue color LEDs respectively. In the case of FIG. 7-4, the electrical circuit includes an electrical connection for supply of electricity and another for supply of signals. Alternatively, some of these contacts may be assigned for other usage like as a communication bus to provide a control signal to rest of the LED panel to turn the rest of LED Assembly On/Off or for purpose as dimmer control as in FIG. 7-3, 7-4, 8-1.

The electric supply to the LED housing 14 is via Electrical Contact, which may consist of control signal residue in Electrical Supply. This control signal may be separated using Control Signal Filter (FIG. 7-3). The control signal may using communication protocol for example Power Line Communication (PLC), HomePlug AV, UWB (Ultra Wide Band) but not limited to these communication protocol. This would enable the LED housing 14 of this invention to have the capability for communication means so as to provide feedback from a remote site where the LED panel/lighting control is located to a control and monitor room. Where in this embodiment, the Control Signal Decoder is capable of controlling individual LED housing 14 via Control and Feedback circuit by changing its flashing frequency, brightness such combination will results in mixing of a spectrum of color formed by RGB LEDs Application of an embodiment of the invention with many LEDs would be when the LED housing are arranged into one or more panels of LED 24. Since the LEDs of this invention can dissipate heat readily, many LEDs could be arranged in such LED panels 24. Since each LED housing 14 is connected with an electrical circuit, each LED housing 14 could be individually replaced if it fails. Replacement could be easily carried out by unscrewing the LED housing 14 from the socket 23 in the heat sink 20 (which is part of in the LED panel 24) and removed.

Likewise, a new LED housing 14 with a new LED assembly 1 could be screwed into the socket 23 and re-connected to the electrical circuit in the LED panel 24. This invention therefore offers an easy method of replacing failed LEDs unlike the LED of the prior art. In any case, the LED of this invention can easily dissipate heat and is less likely to fail.

A LED housing 14 can hold either one LED assembly 1 of one color or two LED assembly 1 of different colors or even three or more LED assembly 1 of different colors.

Since each LED housing 14 is connected with an electrical circuit, the LED could be switch on or off in a sequenced pattern to perform the function of traffic lights or advertisement boards.

Since each LED housing is connected with an electrical circuit, an application of the LED of this invention is use of a plurality of LED housing 14 to form a LED panel 24, which could be switched on or off in a sequenced pattern to perform the function of traffic lights or advertisement boards. It is likely that some LED would fail after its pre-determined life span has been reached. By having an electrical circuit and communication means, a maintenance team could be alerted only if a pre-determined number of LEDs have failed so that maintenance could be carried out. Alternatively, the LED could have a pre-determined life span and upon reaching its pre-determined life span, a signal is sent from the LED housing 14 to the control room so that maintenance could be carried out.

Again by virtue of its shaped cross section (be it bolt shaped or cylindrical or mushroom shaped), a LED housing 14 of this invention can be easily unscrewed from its similarly shaped socket and a new LED housing screwed on or snapped on. A LED housing removal and installation tool which fits the shaped LED housing could be adapted for use to facilitate easy unscrewing and screwing or easy locking and unlocking or easy snapping and removal of the LED housing 14 from the socket 23.

FIGS. 8-1, 8-2, 8-3 and 8-4 are proposed embodiments of improved LED panels 24 which provide a more efficient luminance compared to LED assemblies of prior art.

The improved LED panels 24 consists of rows of LED housings of the invention made into one or more panels of LED denoted by A1, A2, A3 and so on (hereinafter referred to as 'LED panels'). In turn the panels of LED can be assembled to form an array of LED panels 100. The array of LED panels 100 could be formed into a narrow angle LED array 301 or a wide angle LED array 302. Narrow angle LED 301 gives out light in a narrow area or narrow angle. Wide angle LED 302 gives out light over a wide area or wide angle. Since the LED housings of this invention can dissipate heat readily, many LEDs could be arranged in such panels without any concern of overheating.

FIG. 8-1 shows a plurality of panels of narrow angle LED 301 and a plurality of panels of wide angle LED 302 arranged to form a LED lamp 300. In the embodiment shown, the LED lamp is mounted on a wall 305 as a street light. The LED lamp 300 has a cover 303 which acts as a UV light filter preventing excess UV light from the LEDs leaking out into ambient air. The LED lamp also has a reflector 304 to adjust for the angle of light so that constant illuminance for the area to be lit is achieved. With the electrical circuit laid in each LED, constant illumination of an area is achieved when the light sensors within the LED lamp sends signals to control the amount of illumination given by each array of narrow angle LED 301 and each array of wide angle LED 302.

The combination of LED Array using Narrow luminance (A1 to A3, A5 to A7) and Wide luminance (A5) array, prearranged in a LED lamp provide a most intelligent and efficient lighting appliance. Each LED Array may be individual controlled by Lighting control unit (as shown in FIG. 9-1), the Power Regulator and Light Sensor Control unit would also determine the amount of ambient light and provide power to enable the LED array to automatically switch on according to the ambient lighting condition. The method of control of each LED array or even LED panel can be using PWM, or linear regulator power to the LED array or LED panel.

The LED panel may be formed by using a series of Narrow luminance angle (example 15 deg) LED Assembly formed a LED Array (as shown in FIG. 9-1)

The lighting appliances using this invented LED panel could be in the form in outward convex shaped shown in embodiment (FIG. 8-1) or Inward concave shape as shown in the embodiment in FIG. 8-2, which provide most efficient luminance distribution which cannot be done using existing light bulbs.

FIGS. 8-4 and 8-5 are alternative embodiments of improved LED lamp.

FIG. 9-1 is an electrical circuit of a lighting control unit 114 for an array of LED panel 100 in the LED lamp of FIG. 8-1. Each array of LED panel 100 consists of a plurality of LED panels of narrow angle LED A1, A2, A3, A4 or plurality of LED panels of wide angle LED, A5, A6, A7, as the case may be. Each array of LED panel 100 is individually controlled by the Lighting control unit 114 which has electricity supplied via electrical supply 112, leading through a power regulator and light sensor 113 via a power supply 115 to a output control 116. From the output control, an output enable signal 117 is fed back to the power regulator and light sensor 113 and a second light sensor 111. The light sensors 111 in the LED lamp would provide information to the power regulator and light sensor 113 and in turn, power supply 115 to output control 116 is controlled, thereby dimming or turning on the luminance for each LED array.

It is to be understood that the invention is not limited to those precise embodiments described herein, and that various changes and modifications as will be obvious to those skilled in the art can be introduced to the invention without departing from the scope of the invention. FIG. 10 shows other embodiments of the LED housing.

FIG. 10-1 shows a LED housing in which the electrical contact is on the undersurface of the upper portion. The electrical contact within the LED housing need not be at the base but on the undersurface of the upper portion. In this embodiment, the electrical circuit 19 on the PCB could also be on the surface of the board instead of being laid inside the PCB (as shown in FIG. 10-2).

FIGS. 10-3 and 10-4 shows two different shaped LED housing. It is also possible the LED housing be circular in cross section and cylindrical in shape. The LED housing could also be in the form of a button with a wider upper portion containing the LED assembly and a base which can be inserted into a socket in the heat sink and upon turning, be locked within the socket of the heat sink. The LED housing could also be snapped into a socket of the heat sink by inserting it into the socket and twisting the same.

The foregoing describes the invention including preferred forms of the LED housing and methods of manufacturing thereof.

Having described preferred embodiments of the invention with reference to the accompanying drawings, it is to be understood that the invention is not limited to those precise embodiments, and that various changes and modifications as will be obvious to those skilled in the art may be effected without departing from the scope or spirit of the invention as defined in the accompanying claims.

ADVANTAGEOUS EFFECTS OF THE INVENTION

A LED housing of this invention has the advantage of easy replacement. With the added feature of the LED housing having electrical circuits containing a voltage regulator, a current control circuit and a monitoring and feedback circuit, the LED assembly within the LED housing would be able to provide information on its performance and any problem encountered by the LED. The LED assembly within the LED housing can likewise receive signals from a remote location and thus can be switched on or off.

With these additional features, the LED housing of this invention can perform many functions and has many applications.

The invention claimed is:

1. A circuit board for a high power LED housing comprising:

one or more LED forming a LED assembly;

a metal body;

said metal body having a top, an upper portion having gripping means, a lower portion and a base;

said LED assembly mounted within the said metal body, and a lens fitted onto said top of said metal body, said lower portion having fitting means on its exterior;

said LED assembly connected by electrical wire to an electrical contact in said metal body;

wherein said LED housing is adapted to be installed on a metal plate acting as a heat sink having a socket by fitting said LED housing into said socket in said heat sink, said socket shaped to receive said lower portion of said LED housing and said LED-housing being removable from said heat sink by unfitting it from said socket;

and in which said LED assembly is connected by said electrical wire to said electrical contact at the base of said metal body, and said electrical contact includes a circuit board comprising a voltage regulator, current control circuit, monitoring and feedback circuit and temperature sensor, and when installed into said heat sink, said LED assembly is connected thereto to an electrical power source so that performance of the LED assembly can be monitored from a remote maintenance center and if the LED assembly fails, its failure can be transmitted to said remote maintenance center for maintenance action.

2. A circuit board for a high power LED housing as claimed in claim 1 in which said circuit board further comprises a motion sensor and a resistor so that if there is no movement, the high power LED housing will be partially bright and if said motion sensor detects the presence of movement of surrounding objects, said motion sensor will activate the circuit board to fully turn on said high power LED housing and upon the cessation of movement, said high power LED housing will once again be partially bright.

3. A circuit board for a high power LED housing as claimed in claim 2 in which said circuit board further comprises a microcontroller and a communication link so that when installed into said heat sink, said LED assembly is connected thereto to an electrical power source and if there is no movement, the high power LED housing will be partially bright and when the motion sensor detects the presence of movement of surrounding objects, said motion sensor will activate said circuit board to turn on said high power LED housing and at the same time, said microcontroller activates said communications link to send a signal to the adjacent forward high power LED housing to brighten up, in accordance with predetermined algorithms so that the LED housing ahead of the moving object gradually brightens while those LED housings behind the moving object gradually return to their partial brightness state.

4. A circuit board for a high power LED housing as claimed in claim 2 in which said circuit board further comprises an infrared detector, a resistor, a microcontroller and a communication link so that when installed into said heat sink, said LED assembly is connected thereto to an electrical power source and if there is no movement, said high power LED housing will be partially bright and when said infrared detector senses the presence of heat in surrounding objects, said infrared detector will activate said circuit board to turn on the high power LED housing and at the same time, said microcontroller will activate said communications link to send a signal to the adjacent forward high power LED housing to brighten up, in accordance with predetermined algorithms so that said LED housing ahead of the moving object gradually brightens while those LED housings behind the moving object gradually return to their partial brightness state.

5. A circuit board for a high power LED housing as claimed in claim 3 wherein said communication link is RF wireless or Infrared or Power Supply line communication or is said High Power LED light beam itself.

* * * * *